US011469665B2

(12) United States Patent
Bertolini et al.

(10) Patent No.: US 11,469,665 B2
(45) Date of Patent: Oct. 11, 2022

(54) SWITCHING CONVERTER WITH ADAPTIVE COMPENSATION

(71) Applicant: STMicroelectronics S.r.l., Agrate Brianza (IT)

(72) Inventors: Alessandro Bertolini, Vermiglio (IT); Alberto Cattani, Cislago (IT); Alessandro Gasparini, Cusano Milanino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 108 days.

(21) Appl. No.: 17/147,123

(22) Filed: Jan. 12, 2021

(65) Prior Publication Data

US 2021/0226531 A1 Jul. 22, 2021

(30) Foreign Application Priority Data

Jan. 17, 2020 (IT) .......................... 102020000000844

(51) Int. Cl.
*H02M 3/156* (2006.01)
*G05F 1/46* (2006.01)
(Continued)

(52) U.S. Cl.
CPC ............ *H02M 3/156* (2013.01); *G05F 1/461* (2013.01); *G05F 1/561* (2013.01); *G05F 1/575* (2013.01);
(Continued)

(58) Field of Classification Search
CPC . H02M 3/156; H02M 1/0025; H03F 3/45183; H03F 2203/45288
See application file for complete search history.

(56) References Cited

U.S. PATENT DOCUMENTS 6,081,166 A * 6/2000 Katakura ............. H03K 3/0322
327/280
6,724,258 B1 4/2004 Fayed
(Continued)

FOREIGN PATENT DOCUMENTS

EP 0663719 A2 7/1995

OTHER PUBLICATIONS

Seong Joong et al, "High Frequency Buck Converter Design Using Time-Based Control Techniques", IEEE Journal of Solid-State Circuits, vol. 50 No. 4, Apr. 2, 2015, pp. 990-1001, XP055727308, USA.
(Continued)

*Primary Examiner* — Kyle J Moody
*Assistant Examiner* — Lakaisha Jackson
(74) *Attorney, Agent, or Firm* — Crowe & Dunlevy

(57) ABSTRACT

A switching converter includes a voltage conversion circuit providing an output voltage from an input voltage and a PWM voltage generated in response to first and second oscillating voltages. The input stage of a transconductor circuit provides an input reference current following a difference between a reference voltage and a voltage dependent on the output voltage and according to a transconductance, and an output stage for providing an output reference current from the input reference current. A phase shifter shifts an oscillating reference voltage according to the output reference current to obtain the first and second oscillating voltages. The transconductance is controlled in response to the input voltage resulting in a change of the input reference current. Compensation for that change is provided by subtracting a variable compensation current from the input reference current, where the variable compensation current is generated in response to the input voltage.

23 Claims, 3 Drawing Sheets

(51) Int. Cl.
 *G05F 1/56* (2006.01)
 *G05F 1/575* (2006.01)
 *G05F 3/26* (2006.01)
 *H03F 3/45* (2006.01)
 *H02M 1/00* (2006.01)

(52) U.S. Cl.
 CPC ......... *G05F 3/262* (2013.01); *H03F 3/45183* (2013.01); *H03F 3/45273* (2013.01); *H02M 1/0025* (2021.05); *H03F 2203/45288* (2013.01)

(56) References Cited

U.S. PATENT DOCUMENTS

| | | | |
|---|---|---|---|
| 8,018,212 B1 | 9/2011 | Petricek | |
| 8,030,999 B2* | 10/2011 | Chatterjee | H03F 3/45071 330/253 |
| 9,571,052 B1* | 2/2017 | Trampitsch | H03G 1/0023 |
| 2017/0187339 A1* | 6/2017 | Moore | H03F 3/45183 |
| 2019/0372536 A1 | 12/2019 | Lind | |

OTHER PUBLICATIONS

IT Search Report and Written Opinion for IT Appl. No. 102020000000844 dated Sep. 4, 2020 (9 pages).

\* cited by examiner

SWITCHING CONVERTER WITH ADAPTIVE COMPENSATION

PRIORITY CLAIM

This application claims the priority benefit of Italian Application for Patent No. 102020000000844, filed on Jan. 17, 2020, the content of which is hereby incorporated by reference in its entirety to the maximum extent allowable by law.

TECHNICAL FIELD

The present invention generally relates to the field of switching converters and, in particular, DC-DC switching converters for converting a direct current input voltage into a direct current output voltage different from the input voltage. More particularly, the present invention relates to a time-based DC-DC switching converter capable of operating with adequate gain and stability for wide-range values of the input voltage.

BACKGROUND

DC-DC switching converters may be used in any electronic system comprising a power source (such as a battery) and one or more electronic/electro-mechanical components each one operating at a respective voltage: in such an electronic system the DC-DC switching converter may be configured to generate multiple controlled output voltages from the (single) input voltage provided by the power source.

This allows saving space, in that the use of multiple power sources within the electronic system to supply different components thereof is avoided.

Recently, time-based DC-DC switching converters have been developed, in which time-based control elements are used in place of wide bandwidth error amplifiers, analog or digital pulse-width modulators, and high resolution analog-to-digital converters (ADCs).

A time-based DC-DC switching converter is disclosed in S. J. Kim, et al., "High Frequency Buck Converter Design Using Time-Based Control Techniques", IEEE Journal of Solid-State Circuits, Vol. 50, No. 4, April 2015 (incorporated by reference).

Such a time-based DC-DC switching converter comprises a PID ("Proportional Integral Derivative") controller (i.e., a control loop mechanism configured to continuously calculate an error value as the difference between a desired setpoint and a measured process variable, and to apply a correction based on proportional, integral, and derivative terms), in which integral action is implemented by current controlled ring oscillator circuits and proportional and derivative actions are implemented by differential transconductor circuits loaded with controlled phase shifting circuits.

Known time-based DC-DC switching converters are not satisfactory for modern technological requirements, and particularly for applications wherein wide-range values of the input voltage are expected. In fact, in case of wide-range values of the input voltage, the PID controller has to be designed to ensure stability in worst case scenario, i.e., when the input voltage takes high values. However, such design criterion determines a low bandwidth at low values of the input voltage.

In other words, in the known time-based DC-DC switching converter, a limited bandwidth at low values of the input voltage is traded for sufficient phase margin at high values of the input voltage.

There is according a need in the art to address the above mentioned issues, and provide a switching converter implementing an adaptive compensation which guarantees adequate gain and phase margin/stability at both high and low values of the input voltage.

SUMMARY

An aspect of the present invention relates to a switching converter for converting a direct current input voltage into a direct current output voltage. The switching converter comprises: a signal generator circuit for providing a pulse-width modulated voltage according to a phase shift between a first oscillating voltage and a second oscillating voltage; a voltage conversion circuit for providing the output voltage according to the input voltage and said pulse-width modulated voltage; a transconductor circuit comprising: an input stage for providing an input reference current according to a difference between a reference voltage and an operative voltage dependent on the output voltage, and according to a transconductance value associated with the transconductor circuit, and an output stage for providing an output reference current based on said input reference current; and a phase shifting circuit for applying a phase shift to an oscillating reference voltage according to the output reference current to obtain said first and second oscillating voltages.

The switching converter further comprises: a regulation circuit for regulating the transconductance value according to the input voltage, the regulation of the transconductance value resulting in a change of the input reference current; and a compensation circuit for compensating a change of the output reference current caused by said change of the input reference current.

According to an embodiment, additional or alternative to any of the preceding embodiments, said regulation circuit comprises a biasing circuit for biasing the input stage with a bias current depending on the input voltage. The input reference current comprises said bias current. Said compensation circuit comprises: a mirroring circuit for mirroring the input reference current to the output stage, and a further biasing circuit for biasing the output stage with a further bias current depending on the input voltage, the further bias current compensating the bias current.

According to an embodiment, additional or alternative to any of the preceding embodiments, the bias current is inversely proportional to the input voltage.

According to an embodiment, additional or alternative to any of the preceding embodiments, the input reference current comprises a first and a second input reference currents each one comprising a respective portion of said bias current. The further bias current comprises a first and a second further bias currents corresponding to the portions of said bias current comprised in the first and a second input reference currents, respectively.

According to an embodiment, additional or alternative to any of the preceding embodiments, the input stage comprises a transistor-based differential input stage. The first and second input reference currents comprise each one half of said bias current.

According to an embodiment, additional or alternative to any of the preceding embodiments, the mirroring circuit comprises a first transistor-based current mirror for mirroring the first input reference current and a second transistor-based current mirror for mirroring the second input reference current. The first and second transistor-based current mirrors are coupled to the input stage.

According to an embodiment, additional or alternative to any of the preceding embodiments, the switching converter also comprises further transconductor circuit configured to provide a further output reference current according to said difference between the reference voltage and the operative voltage and according to the transconductance value associated with the further transconductor circuit. The switching converter further comprises a reference voltage generating circuit for generating said oscillating reference voltage according to the further output reference current. The switching converter is a time-based switching converter. The transconductor circuit, the voltage generating circuit and the phase shifting circuit identify a proportional integral derivative controller of the time-based switching converter.

According to an embodiment, additional or alternative to any of the preceding embodiments, the switching converter is a buck converter.

Another aspect of the present invention relates to an electronic system comprising such a switching converter.

A further aspect of the present invention relates to a method for converting a direct current input voltage into a direct current output voltage. The method comprises: providing a pulse-width modulated voltage according to a phase shift between a first oscillating voltage and a second oscillating voltage; providing the output voltage according to the input voltage and said pulse-width modulated voltage; providing, at an input stage of a transconductor circuit, an input reference current according to a difference between a reference voltage and an operative voltage dependent on the output voltage, and according to a transconductance value associated with the transconductor circuit; providing, at an output stage of the transconductor circuit, an output reference current based on said input reference current; and phase shifting an oscillating reference voltage according to the output reference current, to obtain said first and second oscillating voltages.

The method further comprises: regulating the transconductance value according to the input voltage, the regulation of the transconductance value resulting in a change of the input reference current, and compensating a change of the output reference current caused by said change of the input reference current.

BRIEF DESCRIPTION OF THE DRAWINGS

These and other features and advantages of the present invention will be made apparent by the following description of some exemplary and non-limitative embodiments thereof; for its better intelligibility, the following description should be read making reference to the attached drawings, wherein.

DETAILED DESCRIPTION

Figure 1:
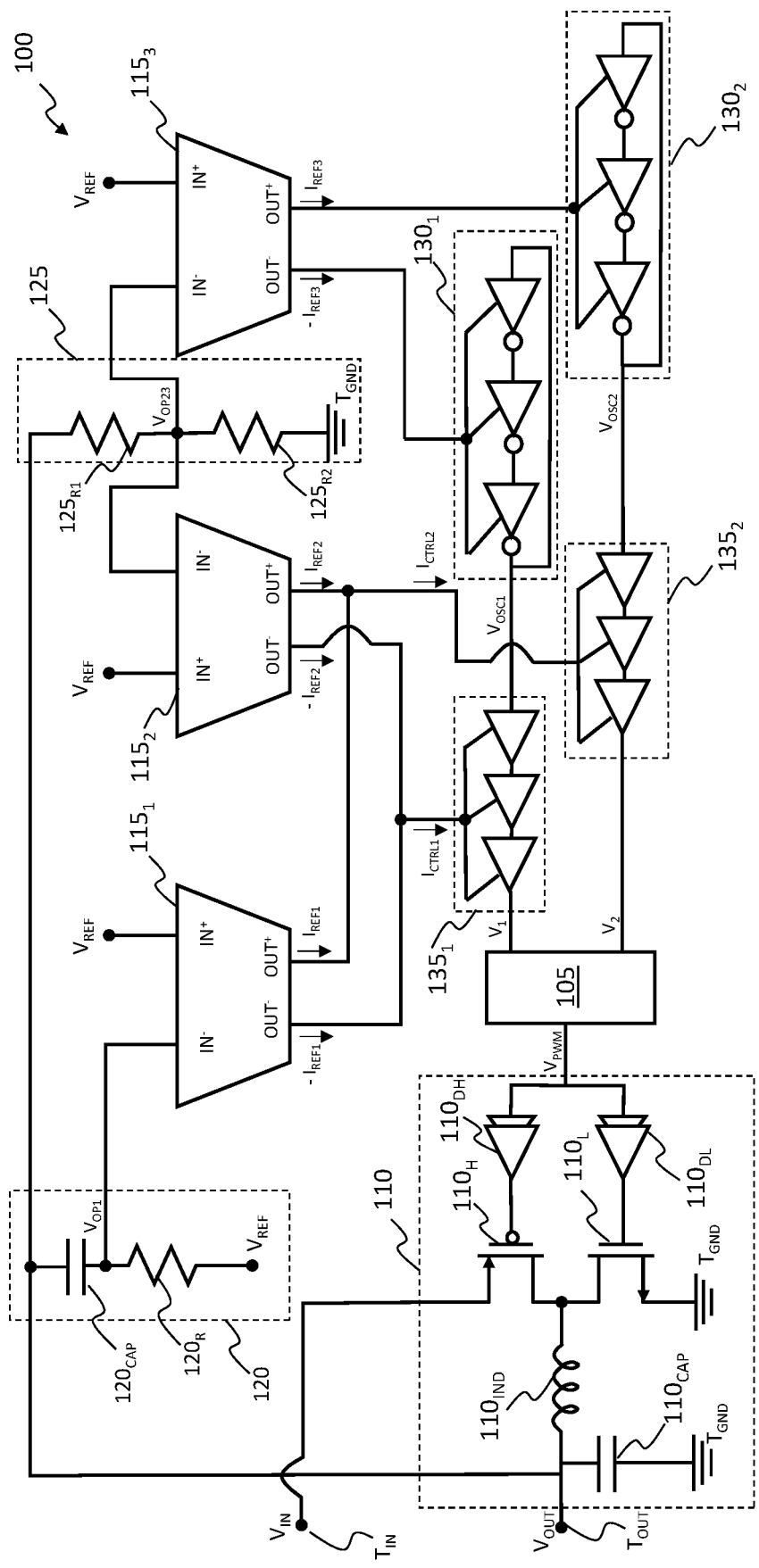
FIG. 1 shows a block diagram of a time-based switching converter wherein embodiments may be applied.

With reference to the drawings, FIG. 1 shows a block diagram of a time-based switching converter (or switching regulator) 100 wherein embodiments may be applied.

According to an embodiment, the switching converter 100 is a DC-DC switching converter, i.e., a switching converter configured to convert a direct current (DC) input voltage $V_{IN}$ into a direct current (DC) output voltage $V_{OUT}$ (the output voltage $V_{OUT}$ being different from the input voltage $V_{IN}$).

According to an embodiment, the output voltage $V_{OUT}$ is lower than the input voltage $V_{IN}$, i.e., the switching converter 100 is a step-down converter (or buck converter). However, the principles equivalently apply to other switching converters, such as step-up converters (or boost converters), in which the output voltage $V_{OUT}$ is higher than the input voltage $V_{IN}$, or a combination of step-down and step-up converters (or buck-boost converters).

Without losing of generality, the switching converter 100 may be used in any electronic system comprising a power source (such as a battery) and one or more electronic/electro-mechanic components each one operating at a respective voltage: in such an electronic system the switching converter 100 (or more thereof) may be configured to generate multiple controlled output voltages from a single input voltage provided by the power source (thus saving space, in that the use of multiple power sources within the electronic system to supply different components thereof is avoided). Examples of such an electronic system include a desktop computer, a server, a laptop computer, a media player (such as an MP3 player), an appliance, a subnotebook/netbook, a tablet computer, a smartphone, a cellular telephone, a network appliance, a personal digital assistant (PDA), a toy, a controller, a digital signal processor, a game console, a device controller, a portable computing device and/or a portable electronic device.

According to an embodiment, the switching converter 100 is a time-based switching converter, i.e., a switching converter wherein time-based control techniques are used in place of wide bandwidth error amplifiers, analog or digital pulse-width modulators, or high resolution analog-to-digital converters (ADCs).

According to an embodiment, the switching converter 100 comprises an input terminal $T_{IN}$ for receiving the input voltage $V_{IN}$ and an output terminal $T_{OUT}$ for providing the output voltage $V_{OUT}$.

According to an embodiment, the switching converter 100 comprises a phase detector circuit 105 for detecting a phase shift between first $V_1$ and second $V_2$ oscillating voltages and for providing a pulse-width modulated voltage $V_{PMW}$ according to the phase shift between the first $V_1$ and second $V_2$ oscillating voltages.

According to an embodiment, the phase detector circuit 105 may be based on a logic circuit including one or more RS latches (or flip-flops).

According to an embodiment, the switching converter 100 comprises a switching circuit 110 for receiving the input voltage $V_{IN}$ and for providing the output voltage $V_{OUT}$ according to the input voltage $V_{IN}$ and the pulse-width modulated voltage $V_{PMW}$. According to an embodiment, the switching circuit 110 comprises a power stage circuit, for example a CMOS power stage circuit.

According to an embodiment, the power stage circuit comprises a high-side switching element (for example, a PMOS transistor) $110_H$ and a low-side switching element (for example, a NMOS transistor) $110_L$.

In the exemplary considered embodiment, the high-side PMOS transistor $110_H$ comprises a source terminal electrically coupled (e.g., directly connected) to the input terminal $T_{IN}$ for receiving the input voltage $V_{IN}$, a gate terminal for receiving the PWM voltage $V_{PWM}$ (or a regenerated version thereof, as discussed here below), and a drain terminal electrically coupled (e.g., directly connected) to the output terminal $T_{OUT}$ of the switching converter 100.

In the exemplary considered embodiment, the low-side NMOS transistor $110_L$ comprises a source terminal electrically coupled (e.g., directly connected) to a ground terminal $T_{GND}$ providing a ground voltage (for example, 0V), a gate terminal for receiving the PWM voltage $V_{PWM}$ (or a regenerated version thereof, as discussed here below), and a drain terminal electrically coupled (e.g., directly connected) to the drain terminal of the high-side PMOS transistor $110_H$.

According to an embodiment, the switching circuit 110 comprises a driving stage circuit for driving the power stage circuit.

In the exemplary considered embodiment, the driving stage circuit comprises a high-side driving circuit $110_{DH}$ (for example, a tapered buffer arrangement) for receiving the PWM voltage $V_{PWM}$ and for providing a regenerated version thereof to the high-side PMOS transistor $110_H$ (particularly, to the gate terminal of the high-side PMOS transistor $110_H$) and a low-side driving circuit $110_{DL}$ (for example, a tapered buffer arrangement) for receiving the PWM voltage $V_{PWM}$ and for providing a regenerated version thereof to the low-side NMOS transistor $110_L$ (particularly, to the gate terminal of the low-side NMOS transistor 110O.

According to an embodiment, the switching circuit 110 comprises a filtering circuit electrically coupled to the drain terminal of the high-side PMOS transistor $110_H$ (and, hence, to the drain terminal of the low-side NMOS transistor $110_L$).

According to an embodiment, the filtering circuit comprises a LC filtering circuit.

According to an embodiment, the filtering circuit comprises an inductor element $110_{IND}$ (or more thereof) having a first terminal electrically coupled (e.g., directly connected) to the drain terminal of the high-side PMOS transistor $110_H$ (and, hence, to the drain terminal of the low-side NMOS transistor 110O and a second terminal electrically coupled (e.g., directly connected) to the output terminal $T_{OUT}$ of the switching converter 100, and a capacitor $110_{CAP}$ (or more thereof) having a first terminal electrically coupled (e.g., directly connected) to the first terminal of the inductor element $110_{IND}$ (and, hence, to the output terminal $T_{OUT}$ of the switching converter 100) and a second terminal electrically coupled (e.g., directly connected) to the ground terminal $T_{GND}$.

Therefore, in the considered embodiment, the drain terminal of the high-side PMOS transistor $110_H$ (and, equivalently, the drain terminal of the low-side NMOS transistor 110O is electrically coupled to the output terminal $T_{OUT}$ of the switching converter 100 through the filtering stage $110_{IND}$, $110_{CAP}$.

According to an embodiment, the switching converter 100 comprises one or more (three, in the example at issue) transconductor circuits $115_1$, $115_2$, $115_3$.

According to an embodiment, each transconductor circuit $115_1$, $115_2$, $115_3$ is associated with a respective transconductance value.

According to an embodiment, each transconductor circuit $115_1$, $115_2$, $115_3$ has a non-inverting input terminal (denoted by "IN+" in the figure) for receiving a reference voltage (e.g., a DC reference voltage) $V_{REF}$, an inverting input terminal (denoted by "IN−" in the figure) electrically coupled to the output terminal $T_{OUT}$ for receiving a respective operative voltage dependent on the output voltage $V_{OUT}$, a non-inverting output terminal (denoted by "OUT+" in the figure) for providing a respective first reference current according to a difference between the reference voltage $V_{REF}$ and the respective operative voltage, and according to the transconductance value associated with the transconductor circuit, and an inverting output terminal (denoted by "OUT−" in the figure) for providing a second reference current opposite (in value) to the first reference current (as better discussed in the following, the first $V_1$ and second $V_2$ oscillating voltages depend on the first and second reference currents).

As will be better discussed in the following when discussing a known implementation of the transconductor circuits and an implementation of the transconductor circuits according to an embodiment, each transconductor circuit is a differential transconductor circuit configured to convert a voltage difference between the reference voltage $V_{REF}$ and the respective operative voltage into a corresponding differential current (depending on the transconductance value associated with the transconductor circuit), the first and second reference currents respectively provided by the non-inverting and inverting output terminals of each transconductor circuit corresponding to such a differential current in respective directions opposite to each other, that differential current comprising a common mode current component.

In the following, the first and second reference currents will be denoted by a same reference symbol (indicative that the first and second reference currents are equal in module), with the exception of the minus sign ("−") associated with the second reference current (indicative that, taking as reference the (same) direction illustrated in the figure for the first and second reference currents, the actual directions of the first and second reference currents are opposite to each other).

According to an embodiment, the transconductor circuit $115_1$ is configured to receive the operative voltage $V_{OP1}$ and to provide the first $I_{REF1}$ and second $I_{REF1}$ reference currents, and each transconductor circuit $115_2$, $115_3$ is configured to receive the operative voltage $V_{OP23}$ and to provide, respectively, the first reference current $I_{REF2}$, $I_{REF3}$ and the second reference current $-I_{REF2}$, $-I_{REF3}$.

According to an embodiment, the non-inverting output terminal of the transconductor circuit $115_1$ is electrically coupled (e.g., directly connected) to the non-inverting output terminal of the transconductor circuit $115_2$.

According to an embodiment, the inverting output terminal of the transconductor circuit $115_1$ is electrically coupled (e.g., directly connected) to the inverting output terminal of the transconductor circuit $115_2$.

According to an embodiment, the operative voltage $V_{OP1}$ is a filtered version of the output voltage $V_{OUT}$.

According to an embodiment, the switching converter 100 comprises a high-pass filter circuit 120 for filtering the output voltage $V_{OUT}$ into the operative voltage $V_{OP1}$.

According to an embodiment, the high-pass filter circuit 120 comprises a capacitor $120_{CAP}$ (or more thereof) having a first terminal electrically coupled (e.g., directly connected) to the output terminal $T_{OUT}$ of the switching converter 100 and a second terminal electrically coupled (e.g., directly connected) to the inverting input terminal of the transconductor circuit $115_1$, and a resistor $120_8$ having a first terminal electrically coupled (e.g., directly connected) to the inverting input terminal of the transconductor circuit $115_1$ and a second terminal electrically for receiving the reference voltage $V_{REF}$.

Therefore, in the considered embodiment, the operative voltage $V_{OP1}$ is a voltage indicative of voltage variations affecting the output voltage $V_{OUT}$. According to an embodiment, the voltage variations "detected" by the high-pass filter 120 are rapid or relatively rapid voltage variations, depending on high-pass filter sizing.

According to an embodiment, the operative voltage $V_{OP23}$ is a scaled version of the output voltage $V_{OUT}$.

According to an embodiment, the switching converter 100 comprises a voltage divider circuit 125 for scaling the output voltage $V_{OUT}$ into the operative voltage $V_{OP23}$. According to an embodiment, the voltage divider circuit 125 comprises a resistor 125$_{81}$ having a first terminal electrically coupled (e.g., electrically connected) to the output terminal $T_{OUT}$ of the switching converter 100 and a second terminal electrically coupled (e.g., directly connected) to the inverting input terminals of the transconductor circuits 115$_2$, 115$_3$, and a resistor 125$_{R2}$ having a first terminal electrically coupled (e.g., directly connected) to the inverting input terminals of the transconductor circuits 115$_2$, 115$_3$ and a second terminal electrically coupled (e.g., directly connected) to the ground terminal $T_{GND}$.

According to an embodiment, the switching converter 100 comprises a number of current controlled ring oscillator circuits configured to provide respective oscillating reference signals according to one or more of the reference currents.

According to an embodiment, the switching converter 100 comprises two current controlled ring oscillator circuits, namely a first current controlled ring oscillator circuit 130$_1$ electrically coupled (e.g., directly connected) to the inverting output terminal of the transconductor circuit 115$_3$ for receiving the second reference current $-I_{REF3}$ and for providing a first oscillating reference voltage $V_{OSC1}$, and a second current controlled ring oscillator circuit 130$_2$ electrically coupled (e.g., directly connected) to the non-inverting output terminal of the transconductor circuit 115$_3$ for receiving the first reference current $I_{REF3}$ and for providing a second oscillating reference voltage $V_{OSC2}$ (as better discussed here below, the first $V_1$ and second $V_2$ oscillating voltages depend on the first $V_{OSC1}$ and second $V_{OSC2}$ oscillating reference voltages, respectively).

According to an embodiment, not shown, the first $V_{OSC1}$ and second $V_{OSC2}$ oscillating reference voltages are generated externally to the switching converter 100, in which case the transconductor circuit 115$_3$ and/or the first 130$_1$ and second 130$_2$ current controlled ring oscillator circuits may be omitted.

According to an embodiment, the switching converter 100 comprises current controlled phase shifting circuits for phase shifting the first $V_{OSC1}$ and second $V_{OSC2}$ oscillating reference voltages according to first $I_{CTRL1}$ and second $I_{CTRL2}$ control currents thereby obtaining the first $V_1$ and second $V_2$ oscillating voltages.

According to an embodiment, the first control current $I_{CTRL1}$ equals to a sum between the second reference current $-I_{REF1}$ provided by the transconductor circuit 115$_1$ and the second reference current $-I_{REF2}$ provided by the transconductor circuit 115$_2$ (i.e. $I_{CTRL1}=-I_{REF1}-I_{REF2}=-(I_{REF1}+I_{REF2})$), and the second control current $I_{CTRL2}$ equals to a sum between the first reference current $I_{REF1}$ provided by the transconductor circuit 115$_1$ and the first reference current $I_{REF2}$ provided by the transconductor circuit 115$_2$ (i.e. $I_{CTRL2}=I_{REF2}+I_{REF1}$), the second control current $I_{CTRL2}$ and the first control current $I_{CTRL1}$ being thus opposite to each other.

According to an embodiment, the switching converter 100 comprises a first current controlled phase shifting circuit 135$_1$ electrically coupled (e.g., directly connected) to the inverting output terminal of the transconductor circuit 115$_1$ (and, hence, to the inverting output terminal of the transconductor circuit 115$_2$) for receiving the first control current $I_{CTRL1}$, to the first current controlled ring oscillator circuit 130$_1$ for receiving the first oscillating reference voltage $V_{OSC1}$, and to the phase detector circuit 105 for providing the first oscillating voltage $V_1$ according to the first oscillating reference voltage $V_{OSC1}$ and to the first control current $I_{CTRL1}$, and a second current controlled phase shifting circuit 135$_2$ electrically coupled (e.g., directly connected) to the non-inverting output terminal of the transconductor circuit 115$_1$ (and, hence, to the non-inverting output terminal of the transconductor circuit 115$_2$) for receiving the second control current $I_{CTRL2}$, to the second current controlled ring oscillator circuit 130$_2$ for receiving the second oscillating reference voltage $V_{OSC2}$, and to the phase detector circuit 105 for providing the second oscillating voltage $V_2$ according to the second oscillating reference voltage $V_{OSC2}$ and to the second control current $I_{CTRL2}$.

According to an embodiment, each current controlled phase shifting circuit 135$_1$, 135$_2$ comprises a n-stage cascade of CMOS inverters (n being sized according to specific design options), although this should not be construed as a limitation.

As disclosed in the article "High Frequency Buck Converter Design Using Time-Based Control Techniques" referenced above, the transconductor circuits 115$_1$, 115$_2$, 115$_3$, the high-pass filter 120, the current controlled ring oscillator circuits 130$_1$, 130$_2$ and the current controlled phase shifting circuits 135$_1$, 135$_2$ identify, as a whole, a PID ("Proportional Integral Derivative") controller, i.e. a control loop mechanism configured to continuously calculate an error value as the difference between a desired setpoint and a measured process variable, and to apply a correction based on proportional, integral, and derivative terms.

Figure 2:
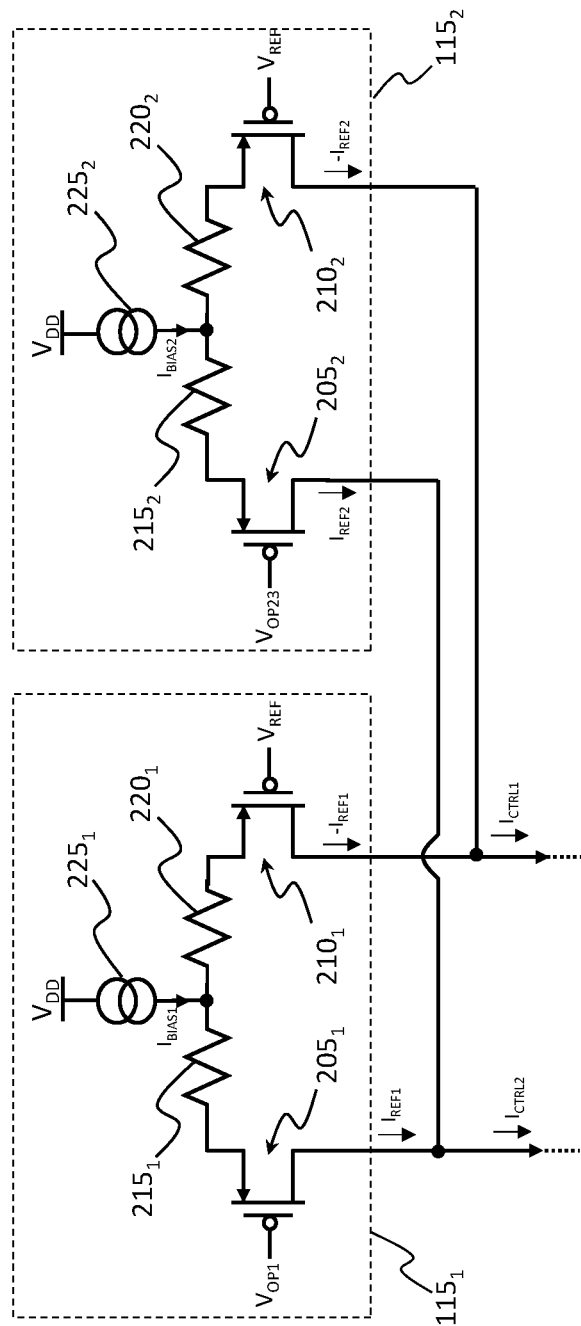
FIG. 2 shows a known circuit implementation of a portion of the switching converter of FIG. 1.

With reference now to FIG. 2, it shows a known circuit implementation of a portion of the switching converter 100. Particularly, FIG. 2 shows a known circuit implementation of the transconductor circuits 115$_1$, 115$_2$.

As visible in the figure, each transconductor circuit 115$_1$, 115$_2$ comprises a conventional input differential stage.

Particularly, the input differential stage of the transconductor circuit 115$_1$ comprises a first input transistor (for example, a PMOS transistor) 205$_1$ and a second input transistor (for example, a PMOS transistor) 210$_1$ coupled to each other in a conventional differential configuration.

More particularly, the first input transistor 205$_1$ has a gate terminal receiving the operative voltage $V_{OP1}$ (the gate terminal of the first input transistor 205$_1$ thus representing the inverting input terminal of the transconductor circuit 115$_1$), a drain terminal providing the first reference current $I_{REF1}$ (the drain terminal of the first input transistor 205$_1$ thus representing the non-inverting output terminal of the transconductor circuit 115$_1$), and a source terminal, and the second input transistor 210$_1$ has a gate terminal receiving the reference voltage $V_{REF}$ (the gate terminal of the second input transistor 210$_1$ thus representing the non-inverting input terminal of the transconductor circuit 115$_1$), a drain terminal providing the second reference current $-I_{REF1}$ (the drain terminal of the second input transistor 210$_1$ thus representing the inverting output terminal of the transconductor circuit 115$_1$), and a source terminal electrically coupled to the source terminal of the first input transistor 205$_1$.

According to the exemplary, not limiting, embodiment herein considered, the input differential stage of the transconductor circuit 115$_1$ further comprises a first input resistor 215$_1$ having a first terminal electrically coupled (e.g., directly connected) to the source terminal of the first input transistor 205$_1$, and a second input resistor 220$_1$ having a first terminal electrically coupled (e.g., directly connected) to the source terminal of the second input transistor 210$_1$, and a second terminal electrically coupled (e.g., directly connected) to the second terminal of the first input resistor $215_1$.

The input differential stage of the transconductor circuit $115_2$ comprises a first input transistor (for example, a PMOS transistor) $205_2$ and a second input transistor (for example, a PMOS transistor) $210_2$ coupled to each other in a conventional differential configuration.

More particularly, the first input transistor $205_2$ has a gate terminal receiving the operative voltage $V_{OP23}$ (the gate terminal of the first input transistor $205_2$ thus representing the non-inverting input terminal of the transconductor circuit $115_2$), a drain terminal providing the first reference current $I_{REF2}$ (the drain terminal of the first input transistor $205_2$ thus representing the non-inverting output terminal of the transconductor circuit $115_2$), and a source terminal, and the second input transistor $210_2$ has a gate terminal receiving the reference voltage $V_{REF}$ (the gate terminal of the second input transistor $210_2$ thus representing the non-inverting input terminal of the transconductor circuit $115_2$), a drain terminal providing the second reference current $-I_{REF2}$ (the drain terminal of the second input transistor $210_2$ thus representing the inverting output terminal of the transconductor circuit $115_2$), and a source terminal electrically coupled to the source terminal of the first input transistor $205_2$.

According to the exemplary, not limiting, embodiment herein considered, the input differential stage of the transconductor circuit $115_2$ further comprises a first input resistor $215_2$ having a first terminal electrically coupled (e.g., directly connected) to the source terminal of the first input transistor $205_2$, and a second input resistor $220_2$ having a first terminal electrically coupled (e.g., directly connected) to the source terminal of the second input transistor $210_2$, and a second terminal electrically coupled (e.g., directly connected) to the second terminal of the first input resistor $215_2$.

As visible in the figure, the drain terminal of the first input transistor $205_1$ of the transconductor circuit $115_1$ is electrically coupled (e.g., directly connected) to the drain terminal of the first input transistor $205_2$ of the transconductor circuit $115_2$, whereby the first reference current $I_{REF1}$ provided by the transconductor circuit $115_1$ and the first reference current $I_{REF2}$ provided by the transconductor circuit $115_2$ sum up to each other and result in the second control current $I_{CTRL2}$, and the drain terminal of the second input transistor $210_1$ of the transconductor circuit $115_1$ is electrically coupled (e.g., directly connected) to the drain terminal of the second input transistor $210_2$ of the transconductor circuit $115_2$, whereby the second reference current $-I_{REF1}$ provided by the transconductor circuit $115_1$ and the second reference current $-I_{REF2}$ provided by the transconductor circuit $115_2$ sum up to each other and result in the first control current $I_{CTRL1}$.

As visible in the figure, each transconductor circuit $115_1$, $115_2$ further comprises a known tail bias current source $225_1$, $225_2$, generally represented as the conventional electric symbol for ideal current generator.

Each tail bias current source $225_1$, $225_2$ is electrically coupled (e.g., directly connected) between a power supply terminal providing a power supply DC voltage $V_{DD}$ and, respectively, the source terminals of the first $205_1$, $205_2$ and second $210_1$, $210_2$ input transistors, so as to bias the input differential stage of the transconductor circuit $115_1$, $115_2$ with a first $I_{BIAS1}$ and a second $I_{BIAS2}$ bias currents, respectively. In the example at issue in which the input differential stage of the transconductor circuit $115_1$ comprises the first $215_1$ and second $220_1$ input resistors and the input differential stage of the transconductor circuit $115_2$ comprises the first $215_2$ and second $220_2$ input resistors, each tail bias current source $225_1$, $225_2$ is electrically coupled (e.g., directly connected) between the power supply terminal and, respectively, the second terminal of the first input resistor $215_1$, $215_2$ (and, hence, the first terminal of the second input resistor $220_1$, $220_2$).

Therefore, according to well-known principles, each of the first $I_{REF1}$, $I_{REF2}$ and second $-I_{REF1}$, $-I_{REF2}$ reference currents comprises a differential reference current (i.e., the current generating by virtue of the difference/unbalance between the reference voltage $V_{REF}$ and the operative voltage $V_{OP1}$, $V_{OP23}$) and (i.e., superimposed to) half of the respective bias current (i.e., $I_{BIAS1}/2$, $I_{BIAS2}/2$).

As can be easily verified, the transfer function $H_{PID}(s)$ of the PID controller may be conceptually expressed as follows:

$$H_{PID}(s) = Gm_1 K_{CCDL} C_D R_D s + Gm_2 K_{CCDL} + \frac{Gm_3 K_{CCO}}{s}$$

$$= K_{CCDL}(Gm_1 C_D R_D s + Gm_2) + \frac{Gm_3 K_{CCO}}{s}$$

wherein:
$K_{CCDL}$ is the gain of the first $135_1$ and second $135_2$ current controlled phase shifting circuits;
$K_{CCO}$ is the gain of the first $130_1$ and second $130_2$ current controlled ring oscillator circuits;
$Gm_1$ is the gain of the transconductor circuit $115_1$ and corresponds, for example, to the transconductance value associated with the transconductor circuit $115_1$;
$Gm_2$ is the gain of the transconductor circuit $115_2$ and corresponds, for example, to the transconductance value associated with the transconductor circuit $115_2$;
$Gm_3$ is the gain of the transconductor circuit $115_3$ and corresponds, for example, to the transconductance value associated with the transconductor circuit $115_3$;
$C_D$ is the capacitance value associated with the capacitor $120_{CAP}$; and
$R_D$ is the resistance value associated with the resistor $120_R$.

It will be noted that, in case of wide-range values of the input voltage $V_{IN}$, the PID controller has to be designed to ensure stability in worst case scenario, i.e. when the input voltage $V_{IN}$ takes high values. However, such design criterion determines a low bandwidth at low values of the input voltage $V_{IN}$. In other words, it will be understood that, in the known circuit implementation of the switching converter 100, a limited bandwidth at low values of the input voltage $V_{IN}$ is traded for sufficient phase margin at high values of the input voltage $V_{IN}$.

Figure 3:
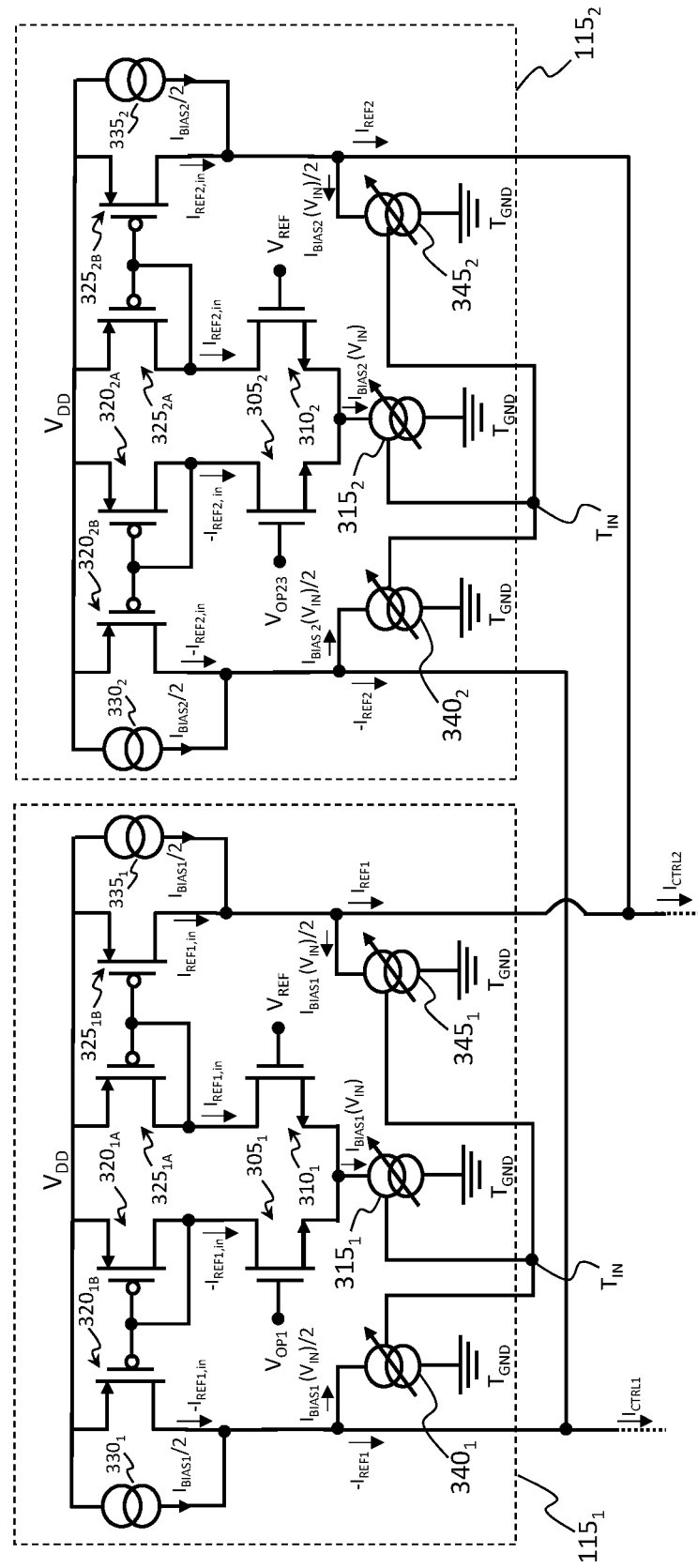
FIG. 3 shows a circuit implementation of a portion of the switching converter of FIG. 1 according to an embodiment.

With reference now to FIG. 3, it shows a circuit implementation of a portion of the switching converter 100 according to an embodiment. Particularly, FIG. 3 shows a circuit implementation of the transconductor circuits $115_1$, $115_2$ according to an embodiment.

According to an embodiment, the transconductor circuits $115_1$, $115_2$ have a same circuit implementation.

According to an embodiment, each transconductor circuit $115_1$, $115_2$ comprises an input stage for providing a respective input reference current according to a difference between the reference voltage $V_{REF}$ and, respectively, the operative voltage $V_{OP1}$, $V_{OP23}$, and an output stage for providing an output reference current (i.e. the reference current $I_{REF1}$, $-T_{REF1}$ and the reference current $I_{REF2}$, $-I_{REF2}$, respectively) based on the input reference current.

According to an embodiment, the input stage of the transconductor circuit $115_1$, $115_2$ comprises a differential stage.

According to an embodiment, the input stage of the transconductor circuit $115_1$, $115_2$ comprises a first input transistor (for example, a NMOS transistor) $305_1$, $305_2$ and a second input transistor (for example, a NMOS transistor) $310_1$, $310_2$ coupled to each other in a differential configuration.

According to an embodiment, the first input transistor $305_1$, $305_2$ has a gate terminal receiving the operative voltage $V_{OP1}$, $V_{OP23}$ (the gate terminal of the first input transistor $305_1$, $305_2$ thus representing the inverting input terminal of the transconductor circuit $115_1$, $115_2$), a drain terminal providing a second input reference current $-I_{REF1,in}$, $-I_{REF2,in}$ (as better discussed in the following, the second reference current $-I_{REF1}$, $-I_{REF2}$ being obtained from the second input reference current $-I_{REF1,in}$, $-I_{REF2,in}$) and a source terminal, and the second input transistor $310_1$, $310_2$ has a gate terminal receiving the reference voltage $V_{REF}$ (the gate terminal of the second input transistor $310_1$, $310_2$ thus representing the non-inverting input terminal of the transconductor circuit $115_1$, $115_2$), a drain terminal providing a first input reference current $I_{REF1,in}$, $I_{REF2,in}$ (as better discussed in the following, the first reference current $I_{REF1}$, $I_{REF2}$ being obtained from the second input reference current $I_{REF1,in}$, $I_{REF2,in}$) and a source terminal electrically coupled (e.g., directly connected) to the source terminal of the first input transistor $305_1$, $305_2$.

According to an embodiment, the switching converter 100 comprises a regulation circuit for regulating the transconductance value associated with the transconductor circuit $115_1$, $115_2$ according to the input voltage $V_{IN}$.

According to an embodiment, the regulation circuit comprises a biasing circuit (for example, a tail bias current source) $315_1$, $315_2$ for biasing the input stage of the transconductor circuit $115_1$, $115_2$ with a respective bias current $I_{BIAS1}(V_{IN})$, $I_{BIAS2}(V_{IN})$ depending on the input voltage $V_{IN}$ (hereinafter referred to as variable bias current), whereby the transconductance value associated with the input stage is variable according to the input voltage $V_{IN}$.

According to an embodiment, the variable bias current $I_{BIAS1}(V_{IN})$ is equal to the variable bias current $I_{BIAS2}(V_{IN})$.

According to an embodiment the variable bias current $I_{BIAS1}(V_{IN})$ is different from the variable bias current $I_{BIAS2}(V_{IN})$.

In the example herein considered in which the tail bias current source $315_1$, $315_2$ is electrically coupled (e.g., directly connected) between the source terminals of the first $305_1$, $310_1$ and second $305_2$, $310_2$ input transistors and the ground terminal $T_{GND}$, when the switching converter 100 is in steady state and the loop is closed, each input of the differential stage is "balanced" (i.e., $V_{REF}=V_{ON}$ in the transconductor circuit $115_1$ and $V_{REF}=V_{OP23}$ in the transconductor circuit $115_2$), and hence the variable bias current $I_{BIAS1}(V_{IN})$, $I_{BIAS2}(V_{IN})$ equally splits among a first branch of the input stage (e.g., the branch including the first input transistor $305_1$, $305_2$) and a second branch of the input stage (e.g., the branch including the second input transistor $310_1$, $310_2$).

Therefore, in this embodiment, the first $I_{REF1,in}$ and second $-I_{REF1,in}$ input reference currents comprise each one the differential reference current (i.e., the current generating by virtue of the difference/unbalance between the reference voltage $V_{REF}$ and the operative voltage $V_{OP1}$) and (i.e., superimposed to) half of the variable bias current $I_{BIAS1}(V_{IN})$, and the first $I_{REF2,in}$ and second $-I_{REF2,in}$ input reference currents comprise each one the differential reference current (i.e., the current generating by virtue of the difference/unbalance between the reference voltage $V_{REF}$ and the operative voltage $V_{OP23}$) and (i.e., superimposed to) half of the variable bias current $I_{BIAS2}(V_{IN})$—in any case, similar considerations apply when, due to specific design option, the first $I_{REF1,in}$, $I_{REF2,in}$ and second $-I_{REF1,in}$, input reference currents comprise each one respective portions of the corresponding variable bias current $I_{BIAS1}(V_{IN})$, $I_{BIAS2}(V_{IN})$.

According to an embodiment, the tail bias current source $315_1$, $315_2$ comprises a dependent or controlled current source (controlled in this case by $V_{IN}$). In the figure, the conventional symbol for controlled current source is used, meaning that the tail bias current source $315_1$, $315_2$ is not limited to any specific implementation of controlled current source.

As conceptually illustrated in the figure, the tail bias current source $315_1$, $315_2$ is electrically coupled (e.g., directly connected) to the input terminal $T_{IN}$ of the switching converter 100 for receiving the input voltage $V_{IN}$ and accordingly generating the variable bias current $I_{BIAS1}(V_{IN})$, $I_{BIAS2}(V_{IN})$.

According to an embodiment, the variable bias current $I_{BIAS1}(V_{IN})$, $I_{BIAS2}(V_{IN})$ is inversely proportional to the input voltage $V_{IN}$ (so that the transconductance values associated with the transconductor circuits $115_1$, $115_2$ decreases as the input voltage $V_{IN}$ increases and increases as the input voltage $V_{IN}$ decreases).

According to an embodiment, the switching converter 100 comprises a compensation circuit for compensating a change in the common mode current component of the output reference current caused by a change in the input reference current resulting from the regulation of the transconductance value.

According to an embodiment, the compensation circuit comprises a mirroring circuit for mirroring the input reference currents $I_{REF1,in}$, $-I_{REF1,in}$, $I_{REF2,in}$, $-I_{REF2,in}$ of the transconductor circuit $115_1$, $115_2$ to respective output stages.

According to an embodiment, the input stage of the transconductor circuit $115_1$ comprises a mirroring circuit for mirroring the input reference currents $I_{REF1,in}$, $-I_{REF1,in}$ to respective first and second output stages of the transconductor circuit $115_1$, and the input stage of the transconductor circuit $115_2$ comprises a mirroring circuit for mirroring the input reference currents $I_{REF2,in}$, $-I_{REF2,in}$ to respective first and second output stages of the transconductor circuit $115_2$.

According to an embodiment, the transconductor circuit $115_1$, $115_2$ comprises a first current mirror for mirroring (e.g., copying) the first input reference current $I_{REF1,in}$, $I_{REF2,in}$ and a second current mirror for mirroring (e.g., copying) the second input reference current $-I_{REF2,in}$, $-I_{REF2,in}$.

According to an embodiment, the first and second current mirrors are conventional current mirrors.

According to an embodiment, the first current mirror of the transconductor circuit $115_1$, $115_2$ comprises a first transistor $320_{1A}$, $320_{2A}$ (e.g., a PMOS transistor) in diode-connected configuration, i.e., having a source terminal receiving the power supply voltage $V_{DD}$, a drain terminal electrically coupled (e.g., directly connected) to the drain terminal of the input transistor $305_1$, $305_2$, and a gate terminal electrically connected to the drain terminal, and a second transistor $320_{1B}$, $320_{2B}$ (e.g., a PMOS transistor) having a source terminal receiving the power supply voltage $V_{DD}$, a gate terminal electrically coupled (e.g., directly connected) to the gate terminal of the first transistor $320_{1A}$, $320_{2A}$, and a drain terminal providing a copy of the second input reference current $-I_{REF1,in}$, $-I_{REF2,in}$.

According to an embodiment, the second current mirror comprises a first transistor $325_{1A}$, $325_{2A}$ (e.g., a PMOS transistor) in diode-connected configuration, i.e. having a source terminal receiving the power supply voltage $V_{DD}$, a drain terminal electrically coupled (e.g., directly connected) to the drain terminal of the input transistor $310_1$, $310_2$ and a gate terminal electrically connected to the drain terminal, and a second transistor $325_{1B}$, $325_{2B}$ (e.g., a PMOS transistor) having a source terminal receiving the power supply voltage $V_{DD}$, a gate terminal electrically coupled (e.g., directly connected) to the gate terminal of the first transistor $325_{1A}$, $325_{2A}$, and a drain terminal providing a copy of the first input reference current $I_{REF1,in}$, $I_{REF2,in}$.

According to an embodiment, the transconductor circuit $115_1$, $115_2$ comprises a first $330_1$, $330_2$ and a second $335_1$, $335_2$ bias current sources, each one generally represented through the conventional electric symbol for ideal current generator.

According to an embodiment, the first bias current sources $330_1$, $330_2$ are electrically coupled (e.g., directly connected) between the source and drain terminals of the second transistors $320_{1B}$, $320_{2B}$, respectively, and the second bias current sources $335_1$, $335_2$ are electrically coupled (e.g., directly connected) between the source and drain terminals of the second transistors $325_{1B}$, $325_{2B}$, respectively.

According to an embodiment, the first $330_1$ and second $335_1$ bias current sources of the transconductor circuit $115_1$ are designed to bias the first and second output stages of the transconductor circuit $115_1$ with a bias current corresponding to the first bias current $I_{BIAS1}$, and the first $330_2$ and second $335_2$ bias current sources of the transconductor circuit $115_2$ are designed to bias the first and second output stages of the transconductor circuit $115_2$ with a bias current corresponding to the second bias current $I_{BIAS2}$.

According to an embodiment, the first $330_1$ and second $335_1$ bias current sources of the transconductor circuit $115_1$ are designed to provide each one half of the first bias current $I_{BIAS1}$ (i.e., $I_{BIAS1}/2$), and the first $330_2$ and second $335_2$ bias current sources of the transconductor circuit $115_2$ are designed to provide each one half of the second bias current $I_{BIAS2}$ (i.e., $I_{BIAS2}/2$). This design option, as better understood from the following discussion, allows the transconductor circuit $115_1$, $115_2$ to provide, through the respective output stage, the same reference currents $I_{REF1}$, $-I_{REF1}$, $I_{REF2}$, $-I_{REF2}$ as in the known implementation discussed in connection with FIG. 2.

According to an embodiment, the compensation circuit comprises a further biasing circuit for biasing the output stages of each transconductor circuit $115_1$, $115_2$ with a further bias current depending on the input voltage $V_{IN}$.

According to an embodiment, the further bias current is designed to compensate the variable bias current $I_{BIAS1}(V_{IN})$, $I_{BIAS2}(V_{IN})$, whereby the further biasing circuit and the further bias current will be referred to as compensation biasing circuit and compensation bias current, respectively.

According to an embodiment, the compensation biasing circuit comprises a first compensation bias current source $340_1$, $340_2$ for biasing the first output stage of the transconductor circuit $115_1$, $115_2$ with a respective compensation variable bias current equal to half of the variable bias current $I_{BIAS1}(V_{IN})$, $I_{BIAS2}(V_{IN})$ (i.e., $I_{BIAS1}(V_{IN})/2$, $I_{BIAS2}(V_{IN})/2$), and a second compensation bias current source $345_1$, $345_2$ for biasing the second output stage of the transconductor circuit $115_1$, $115_2$ with a respective compensation variable bias current equal to half of the variable bias current $I_{BIAS1}(V_{IN})$, $I_{BIAS2}(V_{IN})$ $I_{BIAS1}(V_{IN})/2$, $I_{BIAS2}(V_{IN})/2$).

According to this embodiment, each variable bias current $I_{BIAS1}(V_{IN})/2$ included in the first $I_{REF1,in}$ and second $-I_{REF1,in}$ input reference currents flowing through the first and second output stages of the transconductor circuit $115_1$ is compensated (deleted; subtracted) by the compensation variable bias current $I_{BIAS1}(V_{IN})/2$ provided by each one of the first $340_1$ and second $345_1$ compensation bias current sources, whereby the output reference current provided by the first and second output stages of the transconductor circuit $115_1$ comprises the first $I_{REF1}$ and second $-T_{REF1}$ reference currents (exactly as the known implementation of FIG. 2) which are unaffected by input voltage changes (in other words, the input voltage changes affect the transconductance value $Gm_1$ associated with the transconductor circuit $115_1$ without affecting the first $T_{REF1}$ and second $-T_{REF1}$ reference currents, and thus the common mode voltage component of the first $T_{REF1}$ and second $-T_{REF1}$ reference currents is fixed (made constant) regardless of change in the input voltage).

Similarly, according to this embodiment, each variable bias current $I_{BIAS2}(V_{In})/2$ included in the first $I_{REF2,in}$ and second $-I_{REF2,in}$ input reference currents flowing through the first and second output stages of the transconductor circuit $115_2$ is compensated (deleted) by the compensation variable bias current $I_{BIAS2}(V_{IN})/2$ provided by each one of the first $340_2$ and second $345_2$ compensation bias current sources, whereby the output reference current provided by the first and second output stages of the transconductor circuit $115_2$ comprises the first $I_{REF2}$ and second $-I_{REF2}$ reference currents (exactly as the known implementation of FIG. 2) which are unaffected by input voltage changes (in other words, the input voltage changes affect the transconductance value $Gm_2$ associated with the transconductor circuit $115_2$ without affecting the first $I_{REF2}$ and second $-I_{REF2}$ reference currents, and thus the common mode voltage component of the first $I_{REF2}$ and second $-I_{REF2}$ reference currents is fixed (made constant) regardless of change in the input voltage).

In any case, in embodiments in which the first $I_{REF1,in}$, $I_{REF2,in}$ and second $-I_{REF1,in}$, $-I_{REF2,in}$ input reference currents (and hence the respective output reference currents) comprise each one respective portions (other than half) of the corresponding variable bias current $I_{BIAS1}(V_{IN})$, $I_{BIAS2}(V_{IN})$, each compensation variable bias current equals (or substantially equals) the portion of the variable bias current $I_{BIAS1}(V_{IN})$, $I_{BIAS2}(V_{IN})$ comprised in the corresponding input reference current.

According to an embodiment, the first compensation bias current source $340_1$, $340_2$ is electrically coupled (e.g., directly connected) between the ground terminal $T_{GND}$ and the drain terminal of the second transistor $320_{1B}$, $320_{2B}$ of the first current mirror of the transconductor circuit $115_1$, $115_2$, such a drain terminal thus representing the inverting output terminal of the transconductor circuit $115_1$, $115_2$.

According to an embodiment, the second compensation bias current source $345_1$, $345_2$ is electrically coupled (e.g., directly connected) between the ground terminal $T_{GND}$ and the drain terminal of the second transistor $325_{1B}$, $325_{2B}$ of the second current mirror of the transconductor circuit $115_1$, $115_2$, such a drain terminal thus representing the non-inverting output terminal of the transconductor circuit $115_1$, $115_2$.

As visible in the figure, the inverting output terminal of the transconductor circuit $115_1$ is electrically coupled (e.g., directly connected) to the inverting output terminal of the transconductor circuit $115_2$ (whereby the second reference current $-I_{REF1}$ provided by the transconductor circuit $115_1$ and the second reference current $-I_{REF2}$ provided by the transconductor circuit $115_2$ sum up to each other and result in the first control current $I_{CTRL1}$), and the non-inverting output terminal of the transconductor circuit $115_1$ is electrically coupled (e.g., directly connected) to the non-inverting output terminal of the transconductor circuit $115_2$ (whereby the first reference current $I_{REF1}$ provided by the transconductor circuit $115_1$ and the first reference current $I_{REF2}$ provided by the transconductor circuit $115_2$ sum up to each other and result in the second control current $I_{CTRL2}$).

According to an embodiment, the compensation variable bias current sources $340_1$, $340_2$, $345_1$, $345_2$ comprise dependent or controlled current sources. In the figure, the conventional symbols for controlled current source are used, meaning that the compensation variable bias current sources $340_1$, $340_2$, $345_1$, $345_2$ are not limited to any specific implementation of controlled current source.

As conceptually illustrated in the figure, each compensation variable bias current source $340_1$, $340_2$, $345_1$, $345_2$ is electrically coupled (e.g., directly connected) to the input terminal $T_{IN}$ of the switching converter 100 for receiving the input voltage $V_{IN}$ and accordingly generating the compensation variable bias current $I_{BIAS1}(V_{IN})/2$, $I_{BIAS2}(V_{IN})/2$.

The switching converter 100 (particularly, the transconductor circuits $115_1$, $115_2$) exhibit high performance regardless of the values of the input voltage $V_{IN}$.

Particularly, thanks to the proposed arrangement of the transconductor circuits $115_1$, $115_2$, without requiring trimming actions, automatic adjusting of the transconductance values associated with the transconductor circuits $115_1$, $115_2$ according to input voltage changes is achieved (which guarantees adequate gain and phase margin/stability at both high and low values of the input voltage $V_{IN}$), while ensuring that the reference currents provided by the transconductor circuits $115_1$, $115_2$ are unaffected by input voltage changes (which allows controlling the current controlled phase shifting circuits $135_1$, $135_2$).

Moreover, the proposed arrangement of the transconductor circuits $115_1$, $115_2$ has a negligible impact on power consumption, complexity and area occupation of the switching converter 100.

Naturally, in order to satisfy local and specific requirements, a person skilled in the art may apply to the invention described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

In particular, similar considerations apply if the switching converter has a different structure or includes equivalent components. In any case, any component thereof may be separated into several elements, or two or more components may be combined into a single element; furthermore, each component can be replicated to support the execution of the corresponding operations in parallel. It should also be noted that (unless otherwise indicated) any interaction between different components generally does not need to be continuous, and may be either direct or indirect through one or more intermediaries.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect).

The invention claimed is:

1. A switching converter for converting a direct current input voltage into a direct current output voltage, wherein the switching converter comprises:
    a signal generator circuit for providing a pulse-width modulated voltage according to a phase shift between a first oscillating voltage and a second oscillating voltage;
    a voltage converting circuit for providing the output voltage in response to the input voltage and said pulse-width modulated voltage;
    a transconductor circuit comprising:
        an input stage for providing an input reference current according to a difference between a reference voltage and an operative voltage that is dependent on the output voltage and according to a transconductance value associated with the transconductor circuit, and
        an output stage for providing a differential output reference current based on said input reference current, said differential output reference current including a positive output reference current and a negative output reference current; and
    a phase shifting circuit including a first phase shifter applying a first phase shift controlled by said positive output reference current to generate said first oscillating voltage and including a second phase shifter applying a second phase shift controlled by said negative output reference current to generate said second oscillating voltage;
    wherein the transconductor circuit further comprises:
        a regulation circuit for regulating the transconductance value according to the input voltage, wherein regulation of the transconductance value results in a change of the input reference current; and
        a compensation circuit configured to subtract compensation currents from said input reference current to generate the positive and negative output reference currents, wherein the compensation currents are generated in response to the input voltage.

2. The switching converter according to claim 1, wherein said regulation circuit comprises a biasing circuit for biasing the input stage with a bias current depending on the input voltage, the input reference current comprising said bias current, and wherein said compensation circuit comprises:
    a mirroring circuit for mirroring the input reference current to the output stage, and
    a further biasing circuit for biasing the output stage with said compensation currents generated depending on the input voltage.

3. The switching converter according to claim 2, wherein the bias current is inversely proportional to the input voltage.

4. The switching converter according to claim 2, wherein the input reference current comprises a first and a second input reference currents each one comprising a respective portion of said bias current, and wherein the compensation currents comprise a first and a second compensation current corresponding to the portions of said bias current comprised in the first and a second input reference currents, respectively.

5. The switching converter according to claim 4, wherein the input stage comprises a transistor-based differential input stage, the first and second input reference currents comprising each one half of said bias current.

6. The switching converter according to claim 4, wherein the mirroring circuit comprises a first transistor-based current mirror for mirroring the first input reference current and a second transistor-based current mirror for mirroring the second input reference current, the first and second transistor-based current mirrors being coupled to the input stage.

7. The switching converter according to claim 1, further comprising a high pass filter circuit configured to generate said operative voltage that is dependent on the output voltage.

8. The switching converter according to claim 1, further comprising a voltage divider circuit configured to generate said operative voltage that is dependent on the output voltage.

9. The switching converter according to claim 1, further comprising:
   a second transconductor circuit comprising:
      a second input stage for providing a second input reference current according to a difference between the reference voltage and a second operative voltage dependent on the output voltage, and according to a transconductance value associated with the second transconductor circuit, and
      a second output stage for providing a second differential output reference current based on said second input reference current, said second differential output reference current including a second positive output reference current and a second negative output reference current;
   wherein the first phase shift of the first phase shifter is further controlled by said second positive output reference current; and
   wherein the second phase shift of the second phase shifter is further controlled by said second negative output reference current.

10. The switching converter according to claim 9, wherein the second transconductor circuit further comprises:
   a second regulation circuit for regulating the transconductance value according to the input voltage, wherein regulation of the transconductance value results in a change of the second input reference current; and
   a second compensation circuit configured to subtract compensation currents from the second input reference current to generate said second positive and negative output reference current signals, wherein the compensation currents are generated in response to the input voltage.

11. The switching converter according to claim 10, wherein the compensation currents ensure that the differential output reference current has a constant common mode current regardless of regulation of the transconductance value.

12. The switching converter according to claim 1, further comprising:
   a first current controlled oscillator configured to generate a first oscillator signal applied to an input of the first phase shifter; and
   a second current controlled oscillator configured to generate a first oscillator signal applied to an input of the first phase shifter.

13. The switching converter according to claim 12, further comprising:
   a third transconductor circuit generating a third differential output reference current in response to a difference between the reference voltage and an operative voltage dependent on the output voltage;
   said third differential output reference current including a third positive output reference current signal and a third negative output reference current signal;
   wherein said first current controlled oscillator is biased by said third positive output reference current signal and wherein said second current controlled oscillator is biased by said third negative output reference current signal.

14. The switching converter according claim 12, wherein the switching converter is a time-based switching converter, the transconductor circuit, the first and second current controlled oscillator circuits and the first and second phase shifting circuits identifying a proportional integral derivative controller of the time-based switching converter.

15. The switching converter according claim 1, wherein the compensation currents ensure that the differential output reference current has a constant common mode current regardless of regulation of the transconductance value.

16. The switching converter according to claim 1, wherein the switching converter is a buck converter.

17. A system comprising at least one switching converter according to claim 1.

18. A transconductor circuit, comprising:
   an input stage including a first variable current source generating a variable bias current in response to a control signal, said variable bias current configured to bias a differential input transistor circuit configured to provide positive and negative input reference currents in response to a difference between a first voltage and a second voltage; and
   an output stage configured to provide a differential output reference current based on said positive and negative input reference currents, said differential output reference current including a positive output reference current and a negative output reference current;
   wherein said output stage includes a compensation circuit comprising:
      a second variable current source generating a first variable compensation current in response to said control signal, wherein said first variable compensation current is subtracted from the positive input reference current to generate said positive output reference current; and
      a third variable current source generating a second variable compensation current in response to said control signal, wherein said second variable compensation current is subtracted from the negative input reference current to generate said negative output reference current.

19. The circuit of claim 18, wherein said output stage comprises:
   a first current mirror circuit configured to mirror the positive input reference current to generate the positive output reference current; and
   a second current mirror circuit configured to mirror the negative input reference current to generate the negative output reference current.

20. The circuit of claim 18, wherein said output stage comprises:
- a first fixed current source configured to generate a first fixed bias current that is added to the positive output reference current; and
- a second fixed current source configured to generate a second fixed bias current that is added to the negative output reference current.

21. The circuit of claim 18, wherein the first variable current source provides a variable common mode bias current component of a differential input reference current formed by the positive and negative input reference currents, and wherein the first and second variable compensation currents generated by the compensation circuit ensures that a common mode component of a differential output reference current formed by the positive and negative output reference currents is fixed regardless of change in the control signal.

22. The method of claim 21, wherein the variable compensation current controls the output reference current to have a common mode component that is fixed regardless of variation in the input voltage.

23. A method for converting a direct current input voltage into a direct current output voltage, the method comprising:

- providing a pulse-width modulated voltage according to a phase shift between a first oscillating voltage and a second oscillating voltage;
- providing the output voltage according to the input voltage and said pulse-width modulated voltage;
- providing, at an input stage of a transconductor circuit, an input reference current according to a difference between a reference voltage and an operative voltage dependent on the output voltage and according to a transconductance value associated with the transconductor circuit, and
- providing, at an output stage of the transconductor circuit, an output reference current based on said input reference current;
- phase shifting an oscillating reference voltage according to the output reference current to obtain said first and second oscillating voltages;
- regulating the transconductance value according to the input voltage, the regulation of the transconductance value resulting in a change of the input reference current; and
- subtracting a variable compensation current from the input reference current to generate said output reference current, wherein the variable compensation current is generated in response to the input voltage.

* * * * *